United States Patent
Kotani

(10) Patent No.: US 7,525,123 B2
(45) Date of Patent: Apr. 28, 2009

(54) SEMICONDUCTOR DEVICE

(75) Inventor: Yasuhisa Kotani, Anan (JP)

(73) Assignee: Nichia Corporation, Anan-shi (JP)

( * ) Notice: Subject to any disclaimer, the term of this patent is extended or adjusted under 35 U.S.C. 154(b) by 174 days.

(21) Appl. No.: 11/162,862

(22) Filed: Sep. 27, 2005

(65) Prior Publication Data

US 2006/0081868 A1 Apr. 20, 2006

(30) Foreign Application Priority Data

Sep. 28, 2004 (JP) ............................ 2004-281283
Jul. 25, 2005 (JP) ............................ 2005-213917

(51) Int. Cl.
*H01L 27/15* (2006.01)
*H01L 31/12* (2006.01)
*H01L 33/00* (2006.01)

(52) U.S. Cl. .................. 257/81; 257/E33.062; 257/40; 257/91; 257/99

(58) Field of Classification Search .......... 257/E29.144, 257/E33.028, E33.063, E33.065, E33.062, 257/734, 91, 99, 40, 79–87
See application file for complete search history.

(56) References Cited

U.S. PATENT DOCUMENTS

| | | | | |
|---|---|---|---|---|
| 4,455,351 A | * | 6/1984 | Camlibel et al. | 257/189 |
| 4,835,783 A | * | 5/1989 | Suyama et al. | 372/46.01 |
| 5,029,175 A | * | 7/1991 | Ohnaka et al. | 372/46.01 |
| 5,474,954 A | * | 12/1995 | Yang | 438/39 |
| 5,499,260 A | * | 3/1996 | Takahashi et al. | 372/46.015 |
| 6,052,399 A | * | 4/2000 | Sun | 372/50.122 |
| 6,100,174 A | | 8/2000 | Takatani | |
| 6,335,215 B1 | * | 1/2002 | Yuang | 438/31 |
| 6,387,721 B1 | * | 5/2002 | Hashimoto et al. | 438/46 |
| 6,583,510 B2 | * | 6/2003 | Hanamaki et al. | 257/775 |
| 6,618,411 B1 | * | 9/2003 | Takiguchi et al. | 372/45.01 |
| 6,670,211 B2 | * | 12/2003 | Ohkubo | 438/33 |
| 6,711,192 B1 | * | 3/2004 | Chikuma et al. | 372/43.01 |
| 6,746,948 B2 | * | 6/2004 | Ueda et al. | 438/604 |
| 6,774,389 B2 | * | 8/2004 | Hanamaki | 257/14 |
| 6,838,701 B2 | * | 1/2005 | Sano | 257/79 |
| 6,897,495 B2 | * | 5/2005 | Yoshida et al. | 257/192 |
| 7,009,218 B2 | * | 3/2006 | Sugimoto et al. | 257/99 |
| 7,072,374 B2 | * | 7/2006 | Matsumura | 372/46.01 |
| 7,091,527 B2 | * | 8/2006 | Yoneda et al. | 257/186 |
| 7,139,298 B2 | * | 11/2006 | Makita et al. | 372/46.01 |

(Continued)

FOREIGN PATENT DOCUMENTS

JP A-H05-291621 11/1993
JP A-H06-275868 9/1994

*Primary Examiner*—Chris C. Chu
(74) *Attorney, Agent, or Firm*—Global IP Counselors, LLP

(57) ABSTRACT

A semiconductor device with high reliability, low voltage, and high luminance is provided by preventing detachment of an electrode by way of obtaining good adhesion of the electrode, even in cases where a face-down mounting of a semiconductor laser is performed, and further, an insulating film and a protective film etc. are disposed in the area other than the area where the electrode is ohmically connected to the semiconductor layer. In a semiconductor device having an electrode electrically connected to the semiconductor layer, a dielectric film and an adhesion film comprising a degenerate semiconductor are stacked in sequence on a portion of a region between the semiconductor layer and the electrode, and the adhesion film is in contact with the electrode.

10 Claims, 5 Drawing Sheets

U.S. PATENT DOCUMENTS

| | | |
|---|---|---|
| 7,187,701 B2 * | 3/2007 | Mihashi et al. .......... 372/46.01 |
| 7,250,631 B2 * | 7/2007 | Yoneda ........................ 257/79 |
| 7,260,130 B2 * | 8/2007 | Takeuchi et al. ......... 372/46.01 |
| 2003/0038294 A1 * | 2/2003 | Sano ........................... 257/91 |
| 2004/0159836 A1 * | 8/2004 | Sugimoto et al. ............. 257/40 |
| 2004/0161010 A1 * | 8/2004 | Matsumura .................. 372/46 |

\* cited by examiner

SEMICONDUCTOR DEVICE

BACKGROUND OF THE INVENTION

1. Field of the Invention

The present invention relates to a semiconductor device and more particularly, to a semiconductor device capable of securing an adhesion film between an electrode and a semiconductor layer or a dielectric film in a electrode section of a semiconductor laser element.

2. Description of the Related Art

Recently, reduction in size and weight, and increase in reliability and power output have been advanced in the field of semiconductor devices, especially in semiconductor lasers, and such devices have been used as light sources in electronic equipment such as personal computers and DVDs, and in medical equipment. Among them, the group III-V Nitride semiconductors have been studied intensively because of their capability to emit light with relatively short wavelengths.

For example, as shown in FIG. 5, a semiconductor laser using a nitride semiconductor comprises an n-type semiconductor layer 32 of an n-type GaN layer and the like, an active layer 35 having an InGaN multiquantum well structure, and a p-type semiconductor layer 36 of a p-type AlGaN layer and the like, and having a ridge formed on the surface thereof that is stacked in sequence on a sapphire substrate 30 via an intermediate layer 31. An n-side ohmic electrode 33 and an n-side pad electrode 34 are stacked on the n-type semiconductor layer 32. The surface of the p-type semiconductor 36 is covered with an insulating layer 38 except the top surface of the ridge, and a p-side ohmic electrode 39 electrically connected to the p-type semiconductor layer 36 is disposed on the ridge. Further, the surface of the stacked structure comprising the p-side ohmic electrode 39, the n-type semiconductor layer 32, the active layer 35, and the p-type semiconductor layer 36 is covered with a protective film 37, except a portion of the p-side ohmic electrode 39. Then, a p-side pad electrode 40 electrically connected to the p-side ohmic electrode 39 is disposed on the protective film 37.

In such semiconductor lasers, reduction in drive voltage and improvement in luminous efficiency have been sought by lowering the resistance of the ohmic contact of the semiconductor layer and the electrode, which has been conducted by selecting a specific material for the electrode (for example, see Japanese laid-open patent application No. 5-291621, and Japanese laid-open patent application No. 6-275868), or by controlling the impurity concentration in the p-type semiconductor layer (for example, see Japanese laid-open patent application No. 10-303504).

However, even if an ohmic contact is established by using such various methods described above, the effect is not sufficient. Especially, when a semiconductor laser is mounted face-down, the semiconductor laser is connected to a heatsink, a stem, or the like, by way of die-bonding via a bump-electrode and the like. Therefore, heat generated in the course of die-bonding is transmitted directly to the bump electrode, the protective film 37, and the like, and adversely affects the performance of the semiconductor laser. That is, when the hot-melt material of for example the bump electrode (for example, Au—Sn eutectic) hardens, the residual stress arising from heat causes distortion. The distortion then concentrates on a portion having weak adhesion and causes a separation between the p-side pad electrode and the insulating layer and between the insulating layer and the p-side ohmic electrode and the like.

If at least one film such as the insulating film and the protective film is disposed between the semiconductor layer and the p-side ohmic electrode, the insufficient adhesion between such films and the materials of the electrode causes problems such as impairment of ohmic contact between the electrode and the semiconductor layer and detachment of the electrode from the semiconductor laser, in the manufacturing processes of the semiconductor device.

SUMMARY OF THE INVENTION

The present invention is devised to solve the above problems, and thus even when the semiconductor laser is mounted face-down, and even when at least one of a insulating film and a protective film is located in the area other than the area where the semiconductor layer and the electrode are ohmically connected, the present invention will provide a semiconductor device that can prevent detachment of the electrode and the like by obtaining good adhesion with the electrode, and thereby can achieve a higher reliability, lower drive voltage, and higher luminance.

According to a first aspect of the present invention, there is provided a semiconductor device having an electrode electrically connected to a semiconductor layer. In a region between the semiconductor layer and the electrode, a dielectric film and an adhesion film comprising a degenerate semiconductor are stacked in sequence on the semiconductor, and the adhesion film is in contact with the electrode.

With this configuration, good adhesion of the electrode with the semiconductor layer and the protective film (dielectric film) can be obtained, so that detachment of the electrode can be prevented. Generally, if the semiconductor layer is a p-type nitride semiconductor layer, an ohmic contact between the p-type semiconductor layer and the electrode is difficult to establish and adhesion between the electrode and the semiconductor layer, and between the insulating film protecting the semiconductor layer and the electrode is insufficient. Accordingly, the effects of the present invention can be exhibited especially advantageously in such cases.

In the above-described semiconductor device, it is preferable that an adhesion film is made of at least one selected from the group consisting of ITO (indium titanium oxide), IZO (indium zinc oxide), GZO (gallium zinc oxide), and AZO (aluminum zinc oxide), a dielectric film is made of at least one selected from the group consisting of $ZrO_2$, $SiO_2$, and $HfO_2$, and an electrode is made of a layer including at least nickel or an alloy of nickel.

By using the materials described above in combination, the adhesion can be enhanced, so that the performance of the semiconductor device can be further improved.

Further, it is preferable that a protective film including the same material as in the dielectric film is disposed so as to cover from a side surface to an end portion of the dielectric film which is located on the semiconductor layer.

With this configuration, even when a face-down mounting is conducted, strong adhesion between the dielectric film and the protective film can be obtained, so that the stress generated by the mounting process can be reduced effectively, and separation of dielectric film and the protective film can be prevented effectively.

It is preferable that a stripe-shaped ridge is formed on the surface of the semiconductor layer and the protective film is disposed so as to cover from a side surface to an end portion of the dielectric film located on the semiconductor layer. It is also preferable that the top surface of the protective film is higher than the top surface of the ridge, or that the protective film has a multilayer structure.

With this configuration, even in a case where a face-down mounting is conducted, the cushion effect of the protective film can be exerted, and damage and detachment etc. of the ridge and the films disposed in the vicinity of the ridge can be effectively prevented.

According to a second aspect of the present invention, there is provided a semiconductor device having an electrode electrically connected to a semiconductor layer with a stripe-shape ridge formed on the surface thereof, and comprising a first insulating film, a second insulating film, and an adhesion film. The first insulating film is partially disposed between the semiconductor layer and the electrode, the second insulating film is disposed to cover from a side surface to the upper surface of the semiconductor layer and to be in contact with the first insulating film, the adhesion film is disposed so as to cover at least a portion of the first insulating film, and the electrode is disposed so as to have a protrusion protruding toward the semiconductor layer on at least a surface facing the semiconductor layer and to be in contact with the adhesion film.

With this configuration, the touch area of the adhesion film and the electrode can be secured to the maximum extent possible without increasing the planer area of the semiconductor device, so that the above-described effects according to the first semiconductor device can be obtained.

In the above-described semiconductor device, it is preferable that a portion of the second insulating film is covered with the first insulating film.

With this configuration, an excess interface in contact with the adhesion film is not formed, so that an adhesion film made of a material having insufficient adhesion with the second insulating film can also be used.

Further, it is preferable that the semiconductor layer has a region thereon where the second insulating film, the first insulating film, and the adhesion film are stacked in sequence.

With this configuration, an excess interface in contact with the adhesion film is not formed, so that an adhesion film made of a material having insufficient adhesion with the second insulating film can also be used.

Further, in the region where the electrode is disposed, it is preferable that the top surface of the second insulating film is higher than the top surface of the ridge.

With this, a cushion effect can be achieved and damage and detachment etc. of the ridge and the films in the vicinity of the ridge can be prevented effectively.

According to a third aspect of the present invention, there is provided a semiconductor device having an electrode electrically connected to a semiconductor layer with a stripe-shape ridge formed on the surface thereof comprising a first insulating film, a second insulating film, and an adhesion film. The first insulating film is partially disposed between the semiconductor layer and the electrode, the second insulating film is disposed from a side surface to the upper surface of the semiconductor layer and is in contact with the first insulating film, the adhesion film is disposed so as to cover at least a portion of the first insulating film, and a portion of a top surface of the adhesion film is higher than the top surface of the ridge. Further, the surface of the semiconductor layer has a region where the second insulating film, the first insulating film, and the adhesion film stacked in sequence. The electrode has a protrusion protruding toward the semiconductor layer on at least a surface facing the semiconductor layer, and is disposed so as to be in contact with the adhesion film.

With this configuration, the touch area of the adhesion film and the electrode can be secured to the maximum extent possible without increasing the planer area of the semiconductor device, so that the above-described effects according to the first semiconductor device can be obtained.

Moreover, it is preferable that the second insulating film includes the same material as in the first insulating film.

With this, strong adhesion between the first insulating film and the second insulating film can be obtained, so that the stress generated by the mounting process can be effectively reduced and separation of the protective film and the dielectric film can be effectively prevented.

Further, the adhesion film preferably comprises a degenerate semiconductor or a metal including a platinum group metal.

With this, adhesion between the electrode and the semiconductor layer or the insulating film etc. can be further strengthened.

Also, the electrode may be disposed over from the first insulating film to the second insulating film via the adhesive film.

With this, an adhered area with the adhesion film can be increased.

Further, it is preferable that the semiconductor device according to the third aspect of the present invention is used in a face-down mounting.

With this, heat dissipation can be secured, and a high performance semiconductor device can be obtained.

According to the present invention, excellent adhesion with the electrode material can be obtained, even if the semiconductor device is mounted face-down, and further, even if an insulating film and/or a protective film are located in the region other than the region where the semiconductor and the electrode are ohmically connected. Therefore, detachment etc. of the electrode can be prevented and a semiconductor device that has higher reliability, lower drive voltage, and higher luminance can be obtained.

DETAILED DESCRIPTION OF THE PREFERRED EMBODIMENTS

Figure 1:
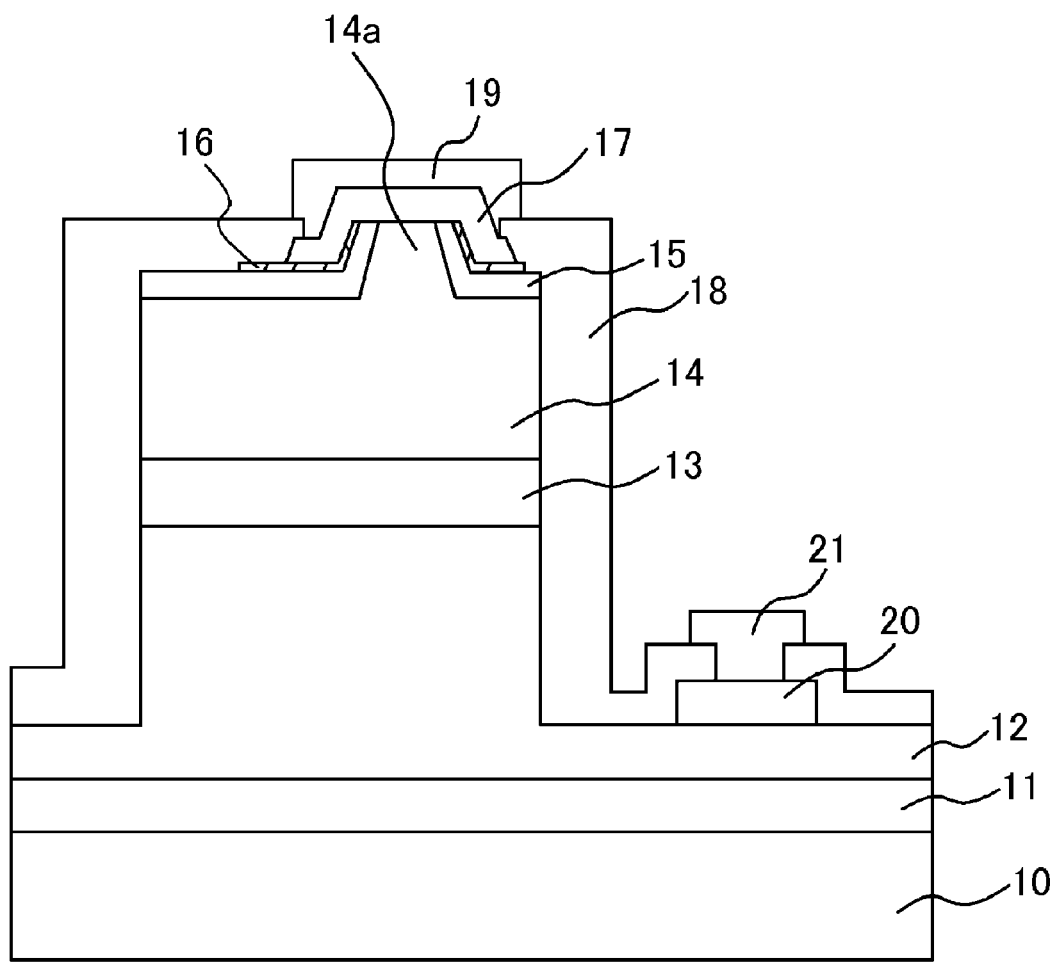
FIG. 1 is a schematic sectional view of the semiconductor device according to an embodiment of the present invention.

A semiconductor device according to a first aspect of the present invention comprises a semiconductor layer and a dielectric film, an adhesion film, and an electrode disposed respectively on the semiconductor layer.

In the present specification, the term "semiconductor device" means all devices comprising a semiconductor layer. Examples of such devices include a light emitting element, a photoreceptor, a CCD (charge-coupled device), a transistor, and a conversion device such as a capacitor, a resistor, a thyristor, a photoelectric converter, a semiconductor laser, and a circuit and the like, using two or more of the aforementioned devices in combination. Among them, a semiconductor layer used in a semiconductor laser is suitable.

Examples of the dielectric film include a single layer or stacked layer of $SiO_2$, $SiN_x$, AlN, $Al_2O_3$, $Ta_2O_5$, $ZrO_2$, SiON, $HfO_2$, $Sc_2O_3$, $Y_2O_3$, and MgO etc. Among those, $ZrO_2$, $SiO_2$, and $HfO_2$ are preferable. With this, adhesion can be further secured in combination with the materials mentioned hereinafter. These films can be formed by using a known method such as sputtering method, ECR (electron cyclotron resonance) sputtering method, CVD (chemical vapor deposition) method, ECR-CVD method, ECR-plasma CVD method, evaporation method, and EB (electron beam) method. The film thickness can be adjusted arbitrarily by selecting the material, for example, to about 400 to 2500 angstroms, and preferably to about 400 to 1000 angstroms.

It is preferable that the dielectric film is disposed on the surface of the semiconductor layer so as to expose a portion of the surface of the semiconductor layer. Disposing the dielectric film in such a manner is for the purpose of securing a region for connecting the electrode on the semiconductor layer and insulating and protecting the surface of the semiconductor layer, except the region for connecting the electrode, by the dielectric layer. Examples of the method for forming the dielectric film to expose a portion of the semiconductor layer include the steps of stacking the dielectric film on the entire surface of the semiconductor layer, disposing a mask having a predetermined pattern by using a known method such as a photolithography and an etching method, and then etching the dielectric film using the mask. Alternatively, a liftoff method and the like may be used.

The adhesion film is made of a degenerate semiconductor and disposed on the dielectric film. At least one of ITO, IZO, GZO, AZO, and the like, is used as the degenerate semiconductor. Also, from another viewpoint, the adhesion film may comprise a transparent conductive film having, for example, a light transmittance of 80% or greater at 380 to 780 nm. Further, the adhesion film may comprise a film having a high electric conductivity (for example, specific resistance of about $1×10^{-3}$ Ω or less). The adhesion film may be a single layer or multilayer comprising a material other than a degenerate semiconductor; for example, a metal comprising a platinum group metal (Pd, Rh, Ru, Os, Ir, and Pt, and a metal including at least one of them) or an oxide thereof. Among those described above, a single layer structure of a degenerate semiconductor is preferable, and further, ITO or IZO is more preferable. That is, the present invention aims to provide an adhesion film disposed in order to secure a strong adhesion of the electrode in accordance with the material of the electrode, even in a case under conventional conditions where a material having insufficient adhesion with the material is used in the dielectric film and the protective film (including the first and second insulating films described hereinafter), and where the electrode is disposed with a shape and position having insufficient adhesion.

The adhesion film is required to cover at least one portion of the dielectric film, and is preferable to cover the entire surface of the dielectric film. That is, it is preferable that the adhesion film is disposed in such way that the after-mentioned electrode is in contact only with the adhesion film and is not in direct contact with the dielectric film. Consequently, the adhesion film may be disposed only on a portion of the dielectric film, on the entire surface of the dielectric film with a size and shape that is the same as the dielectric film, on from a portion of the dielectric film to a portion of the semiconductor layer, or on the entire surface of the dielectric film with a size larger than the dielectric film and in direct contact with the semiconductor layer.

The adhesion film can be disposed using a known method in the art, in the same manner as the aforementioned dielectric film. In a case where a patterning is carried out in order to form an desired shape, a photolithography, an etching method, and a liftoff method and the like, can be used, as described above. Patterning of the adhesion film can be carried out at the same time with the above-described dielectric film, depending on the desired shape of the adhesion film. The film thickness of the adhesion film can be adjusted to, for example, about 50 to 500 angstroms, and preferably about 100 to 300 angstroms, by selecting the material etc.

The electrode is disposed over the semiconductor layer via a protective film, an adhesion film, and a dielectric film etc., except the region establishing an electric connection. The material for the electrode is not specifically limited except the electrical conductivity thereof, and a material capable of establishing ohmic contact with the semiconductor layer is preferable.

For example, when the semiconductor layer over which the electrode to be disposed is p-type as described below, the electrode can be made of a single layer or multilayer of metal such as palladium, platinum, nickel, gold, titanium, tungsten, copper, silver, zinc, indium, aluminum, and the like, or an alloy thereof. Examples include Ni—Au system, Ni—Au—Pt system, Pd—Pt system, Ni—Pt system, Pt—Au system, and ITO system. More specific examples include ITO, Ni/ITO, ITO/Pt, ITO/Rh, Ni/Au, Ni/Au/Pt, Pd/Pt, Rh/Ir/Pt, Pt/Au, Ir/Au, and Ir/Pt. Among them, a single layer including nickel or an alloy thereof, or a multilayer having a layer including nickel or an alloy thereof located in contact with the adhesion film is preferable. With this construction, the electrode can be adhered strongly to the semiconductor layer and/or the insulating film, protective film, and the like. The film thickness of the electrode can be adjusted arbitrarily by selecting its material, and a preferable film thickness is, for example, about from 500 to 1500 angstroms.

In addition, a pad electrode may be disposed on the electrode. It is preferable that the pad electrode (preferably, a p-side pad electrode) has a multilayer structure. With this, detachment of the electrode can be prevented.

A first layer included in the pad electrode and in contact with the electrode is preferably selected from palladium, platinum, nickel, gold, titanium, tungsten, copper, silver, zinc, indium, and aluminum. A second layer which is disposed on the first layer is preferably selected from palladium, ruthenium, rhodium, platinum, tungsten, and molybdenum. Further, it is preferable that a third layer is disposed on the second layer, and preferably selected from materials having good adhesion with a standard pad electrode. A layer made of other material may be disposed between each layer.

Specific examples of the pad electrode include a multilayer such as Ti—Pt—Au, Ti—Pd—Au, W—Pt—Au, and W—Pd—Au. Such multilayer includes the first layer so that occurrence of detachment due to diffusion of the materials in the upper layers than the first layer into the electrode can be prevented. Further, by having the second layer, detachment of the pad electrode due to diffusion of a metallization layer such as Au—Sn can be prevented.

In a case where the semiconductor layer included in the pad electrode is n-type as described below, examples thereof include Ti—Al system, V—Pt system, Ti—Al—Ti—Pt system, W—Al—W system, Ti—Mo—Ti—Pt system, and Ti—Pt system. Here, it is preferable that the film thickness is, for example, about 100 nm to 10 μm.

The electrode can be formed, for example, using a known method in the art in the same manner as the dielectric film. The electrode is disposed on almost the entire upper surface of the semiconductor layer, and then, patterning is carried out by using photolithography and etching process, liftoff method, and EB method etc. In addition, the electrode is required to be formed at least on the semiconductor layer, and it is preferable that the electrode is disposed so as to ohmically connect to a portion of the semiconductor layer and strongly adhere to the adhesion film on the adhesion film. Here, it is important that the electrode is disposed in a manner that the electrode and the dielectric film are not in direct contact with each other.

Examples of the semiconductor layer included in the semiconductor device of the present invention include various semiconductor layers such as an elemental semiconductor layer of silicon, germanium etc., a group III-V compound semiconductor layer of GaAs, AlN, InP, GaN, AlGaN, AlInGaN, InN, and a group II-VI compound semiconductor layer of ZnSe, CdTe, and CdS. Among them, a nitride semiconductor, that is, GaN, AlN, and InN or their mixed crystals (for example, $In_xAl_yGa_{1-x-y}N$, $0 \leqq x$, $0 \leqq y$, $x+y \leqq 1$), and the like, are preferable. The semiconductor layer may be doped with a p-type impurity (for example, Mg, Zn, Cd, Be, Ca, and Ba etc.) or a n-type impurity (for example, Si, Sn, Ge, Se, C, Ti etc.). The doped concentration is, for example, about $1 \times 10^{16}$ to $10^{19}$ $cm^{-3}$. Especially, a nitride semiconductor layer including a p-type impurity is preferable.

The semiconductor layers described above can be formed by using any known methods in the art, such as MOVPE (metal-organic vapor phase deposition), MOCVD (metal-organic chemical vapor phase deposition), HVPE (halide vapor phase deposition), and MBE (molecular beam epitaxy) etc.

In the semiconductor device of the present invention, it is preferable that, for example, an n-type semiconductor layer, an active layer, and a p-type semiconductor layer are formed in sequence on a substrate.

As for the substrate, a semiconductor that is different from the semiconductor layer, for example, a foreign substrate comprising a material different than the nitride semiconductor can be used. Examples thereof include a substrate such as sapphire having a principal plane of C-plane, R-plane, or A-plane, spinel ($MgAl_2O_4$), GaAs, an oxide substrate which is in lattice match with the nitride semiconductor, and a conductive substrate such as ZnS, ZnO, Si, SiC, AlN, GaN. A pseudo-substrate comprising a foreign substrate and a under layer having fewer crystal defects (for example, the number of dislocations of $1 \times 10^7/cm^2$ or less, preferably $1 \times 10^7/cm^2$ or less) is preferable. A semiconductor substrate or nitride semiconductor substrate and the like obtained by removing the foreign substrate from the pseudo-substrate may also be used. The under layer, the semiconductor substrate, or the nitride semiconductor substrate preferably includes an n-type impurity.

In a case where the insulating substrate is not finally removed, a p-side electrode and an n-side electrode described later are disposed on the same side of the nitride semiconductor layer so that a face-up mounting can be carried out. That is, the semiconductor layer side can be used as the main light extract surface. Alternatively, a flip-chip mounting can also be applied, and the insulating substrate side can be used as the main light extracting surface. In this case, a metallization layer (bump: a metal or alloy and solder etc. of Ag, Au, Sn, In, Bi, CU, and/or Zn, especially preferably a solder, Au—Sn eutectic material, Ag paste, and an alloy of In, and further preferably with high bonding strength and/or good heat dissipation) is preferably disposed respectively on the p-side electrode and the n-side electrode so as to connect to an external electrode, and each metallization layer is connected respectively to one of a pair of external electrodes disposed on the submount. Then, a wire and the like are attached to the submount. Alternatively, the substrate may eventually be removed to proceed to face-up mounting or flip-chip mounting. In addition, the p-side electrode and the n-side electrode may be located at the opposite surfaces of the substrate (at each side of the substrate).

Especially in the laser element designed to obtain high output beam by applying a large input power, it is necessary to enhance the heat dissipation and increase the film thickness of the protective film and the dielectric film, relative to an increase in the output power. Even in such a case, adhesion between the electrode and the semiconductor layer or the dielectric layer can be secured by providing a heatsink and the like at the most thermogenous portion in the device, and a face-down mounting can be carried out more reliably. Moreover, detachment of the electrode due to an increase in the film thickness of the insulating film etc. can also be avoided. As a result, heat dissipation can be enhanced so that a semiconductor device with higher performance can be obtained.

In order to prevent occurrence of a microscopic crack within the multilayer semiconductor layer, it is preferable to use a substrate having a step with an off-angle of about $0.01°$ to $0.3°$ or about $0.05°$ to $2°$ on either one surface or both surfaces. By forming the off-angle as described above, the occurrence of a microscopic crack in the laterally grown semiconductor layer can be prevented. With this, the surface configuration of the selectively grown semiconductor layer can be prevented from forming a step. Therefore, a step is not exaggerated in the element structure constructed thereon, so that short-circuit and elevation of the threshold level can be prevented, and the service life can be improved.

At least one semiconductor layer such as a buffer layer and an under layer can be grown on the substrate before forming the above-mentioned semiconductor layer etc. Also, after forming such layers, the substrate may be either ground to reduce its thickness or removed, or an off-angle may be made on the substrate. The substrate may also be either ground to reduce its thickness or removed after forming the device structure.

Especially, a mismatch of the lattice constant between the substrate and the stacked semiconductor layer can be reduced by providing a buffer layer therebetween, so that a defect such as distortion and dislocation in the stacked semiconductor layers grown on the buffer layer can be reduced effectively. The buffer layer is preferably grown at a low temperature, for example, at about 200 to 900° C. Examples of the buffer layer include AlN, GaN, AlGaN, and InGaN. The thickness of the buffer layer is preferably about several dozen to several hundred angstroms.

In a case where an under layer is formed by lateral growth on the buffer layer, the dislocation can be further reduced. A substrate having an irregular surface can be used as the under layer. Alternatively, the under layer can be prepared by forming growth nuclei made of a semiconductor layer with a periodic shape of, for example, stripe, grid, mesh, and island, on the surface of the buffer layer, and then growing the semiconductor layer from the growth nuclei in the lateral direction until they joining each other. By using such a substrate or buffer layer, stress at the interface between the substrate and the under layer can be reduced, so that a defect such as distortion and dislocation can be prevented.

Alternatively, after a patterned protective film is grown on the substrate and a semiconductor layer is grown on the protective film, the lateral growth is stopped so as to form a semiconductor layer having a periodical T-shaped cross-section. In this semiconductor layer, a low-defect region is formed in the region which is laterally grown. Further, with the top surface or the top surface and the laterally-grow side surface as the growth nuclei, the semiconductor layer is regrown laterally until joining each other so as to cover the entire surface of the substrate. With this, cavities will be left under the portions where the adjacent semiconductor layers joined, so that a region with less dislocation can be formed in a wide area without concentrating dislocations in this region. Specific example of the number of dislocations is described above.

Here, the protective film preferably has properties that does not allow or hardly allow a semiconductor layer to grow thereon. Examples of such protective film include an oxide such as silicon oxide, titanium oxide, and zirconium oxide, a nitride such as silicon nitride and titanium nitride, and a stacked layer of those layers, and a film made of a high melting point metal etc., such as tungsten, titanium, and tantalum, with a melting point higher than 1200° C. Among those, silicon oxide and silicon nitride are preferable. Examples of the method for forming such layer with a pattern include a method where a mask is formed with a predetermined shape by using photolithography, and a film is formed via the mask by using a vapor phase deposition such as vapor deposition, sputtering technique, and CVD method. The protective film can be patterned with dots, stripes, grid, mesh, and the like. Among those patterns, stripes are preferable, and further, stripes arranged perpendicular to the orientation-flat plane (for example, A-plane of sapphire) is more preferable.

An active layer which is a part of the semiconductor layer of the present invention is, for example, roughly parallel to the joint surface of a first conductive-type semiconductor layer and a second conductive-type semiconductor layer, and includes a so-called waveguide, which is a region where the electric current is confined in a stripe-shape. The active layer may either be a single layer or a multilayer made of a single material (element or compound etc., hereinafter described in the same way), and a multilayer made of different materials (compounds made of different elements, and compounds made of the same kind of elements with different composition ratios, etc., hereinafter described in the same way) is more preferable. When the semiconductor layer is formed on the under layer, it is preferable that the region of the under layer which is below the waveguide is a region with less dislocation.

It is preferable that a first conductive semiconductor layer and a second conductive semiconductor layer are formed so that the active layer is located in between, as the n-type and p-type cladding layers respectively. Other than the cladding layers, as the first conductive type semiconductor layer, a light guide layer, a crack preventing layer, a contact layer, a cap layer and the like may be formed singly or in combination between the cladding layer and the active layer or on the cladding layer of the opposite side of the active layer, and as the second conductive type semiconductor layer, an electron confinement layer, a light guide layer, a cap layer, and a contact layer and the like may be formed singly or in combination between the active layer and the cladding layer or on the cladding layer of the opposite side of the active layer.

A specific example of the semiconductor layer of the present invention includes a layered structure of the nitride semiconductor layers formed on the substrate, which comprises a under layer, a n-type contact layer of an nitride semiconductor layer doped with an n-type impurity, a crack preventing layer (omissible) of $In_aGa_{1-a}N$ ($0.05 \leq a \leq 0.2$), an n-type cladding layer having a superlattice multilayer structure including $Al_bGa_{1-b}N$ ($0.05 \leq b < 0.3$), an n-type guide layer of an nitride semiconductor layer (InAlGaN) having a band-gap energy smaller than that of the cladding layer, an active layer having a multiquantum well structure of $In_cGa_{1-c}N$ ($0 \leq c < 1$), a p-type electron confinement layer (omissible) comprising at least one layer of $Al_dGa_{1-d}N$ ($0 < d \leq 1$), a p-type guide layer of an nitride semiconductor layer (InAlGaN) having a band-gap energy smaller than that of the cladding layer, a p-type cladding layer having a superlattice multilayer structure including $Al_eGa_{1-e}N$ ($0.05 \leq e < 0.3$), and an nitride semiconductor layer having a stripe-shaped ridge made of a p-type contact layer of an nitride semiconductor layer doped with a p-type impurity.

In a case where the substrate is conductive, the under layer and the n-type contact layer and the like may be omitted so that the electrode can be disposed directly on the rear face (the surface where the active layer etc. are not formed) of the substrate.

It is preferable that a stripe-shaped ridge is formed on the second conductive type semiconductor layer. The width of the ridge is not specifically limited, and the width thereof may be about 0.1 to 10 µm, suitably about 0.5 to 5 µm, and more preferably about 1.5 to 5 µm. The height of the ridge can be adjusted according to the thickness of the second conductive type semiconductor layer. For example, the height thereof may be about 0.2 to 3 µm, and preferably about 0.3 to 0.5 µm.

A portion of respective layers of the upper surface of the first conductive type semiconductor layer is exposed by removing a portion of the second conductive type semiconductor layer, the active layer, and the first conductive type semiconductor layer typically in the depth direction, for example, at one side of the ridge. Also, at the opposite side of the ridge, that is, at the other side of the ridge, a portion or the entire portion of the second conductive type semiconductor layer, a portion or the entire portion of the second conductive type semiconductor layer and the active layer; or a portion or the entire portion of the second conductive type semiconductor layer, the active layer, and the first conductive type semiconductor layer, may be removed in the depth direction of the layers. With this, the volume of the active layer and the second conductive type semiconductor layer (or further, volume of the active layer and the first conductive type semiconductor layer) can be reduced. As a result, the impedance at the initial driving can be stabilized so that the laser oscillation can be initiated quickly. Thus, a device with a short warm-up time and a high speed response time can be obtained.

In the semiconductor device of the present invention, further, a protective layer may be disposed. The protective film is required to cover at least a portion of the adhesion film, and may also cover a portion of the dielectric film. The configuration of the protective film covering the dielectric film is not specifically limited. However, it is necessary that the protective film is disposed so as not to impair the light confinement effect of the dielectric film above the waveguide of the active layer. Thus, the light confinement effect can be sufficiently controlled. For example, in a case where a ridge is formed, the protective film may be disposed to the extent of about 5 to 15 µm from the edge of the ridge. In other words, regardless of the width of the semiconductor layer (for example, the second conductive type semiconductor layer), the protective layer may be disposed to cover more than about 60%, preferably more than about 80% of the upper surface of the semiconductor layer. By disposing the protective film, the stress at the interface between the protective film and the dielectric film can be sufficiently reduced especially in the face-down mounting, and separation of the protective film and the dielectric film can be prevented.

It is preferable that the protective film includes the same substance (material) as the dielectric film. Here, the same substance means, for example, in a case where the dielectric film is made of Zr oxide, the protective film also includes Zr oxide. The composition of the protective film may vary slightly according to the method of the production. In a case where the dielectric film is made of a single layer of Zr, the protective film may be either a single layer of Zr or a multilayer including at least Ze oxide. For example, it is preferable that the protective film is a multilayer film in which a film of Zr oxide is located at the side in contact with the dielectric film. Such multilayer include a multilayer of two-layer structure with a Si oxide film where Zr oxide is included only in the lower layer (Ze oxide/Si oxide film and the like), a multilayer of three-layer structure where a Zr oxide film is disposed on both the upper and lower sides of such as a Si oxide film (Zr oxide/Si oxide/Zr oxide film and the like). Also, a nitride having good adhesion with Ti and W may be used as the protective film, and a multilayer film of an oxide and a nitride (for example, a multilayer of $SiO_2$ and SiN) can also be used as the protective film.

It is preferable that the protective film is substantively thicker than the dielectric film. That is, the protective film has a thickness sufficient to protect at least the side surfaces of the semiconductor layer from various damage and effects. Specifically, the suitable thickness is about 2000 to 7000 Å, and more preferably about 4000 to 5000 Å. Especially, in the multilayer made of Si oxide and Zr oxide, the film thickness of a Zr oxide/Si oxide film is about 200 to 1300 Å/1000 to 40000 Å, the film thickness of a Zr oxide/Si oxide/Zr oxide film is preferably about 200 to 1300 Å/1000 to 4000 Å/200 to 1300 Å, and the total film thickness is about 4000 to 5000 Å.

In a case where the semiconductor layer has a ridge, it is preferable that the upper surface of the protective film is located higher than the top surface of the ridge. With this configuration, a cushion effect can be exerted on the ridge so that the stress on the ridge and its adjacent region can be reduced.

The semiconductor device according to the second and the third aspects of the present invention has the construction below.

(1) A stripe-shaped ridge is formed on the surface of the semiconductor layer;

(2) A first insulating film is disposed on a portion of the region between the semiconductor layer and the electrode;

(3) A second insulating layer is disposed so as to cover from the side surfaces to the upper surface of the semiconductor layer and to come in contact with the first insulating layer;

(4) An adhesion film is disposed so as to cover at least a portion of the first insulating layer; and (5) An electrode is disposed so as to have a substantially the same configuration or portion, or a similar construction as in the semiconductor device according to the first aspect of the invention, except that the electrode has a protrusion protruding toward the semiconductor layer at least on the surface connected to the semiconductor layer and is disposed so as to come in contact with the above-mentioned adhesion film, and functions in the same way or in a similar way as in the semiconductor device according to the first aspect of the invention. By employing such configuration, the contact area of the adhesion film and the electrode can be secured to a maximum extent without increasing the planar area of the semiconductor device.

Here, the first insulating layer may be formed by using a similar material and method etc. as the above-described dielectric film, except that the shape and the location are partially different. It is preferable that the first insulating layer is in contact with at least the second insulating film described later, and a portion of the first insulating layer covers at least a portion of the second insulating layer. With this configuration, an excess interface which is in contact with the adhesion film does not occur, so that an adhesion film made of a material having insufficient adhesion with the second insulating layer can also be used. It is preferable that a portion of the first insulating film also covers a portion of the semiconductor layer.

The second insulating film may be formed using a similar material and method as the above-described protective film except that the shape and location are partially different. It is preferable that the second insulating film is disposed so as to directly cover a portion of the upper surface of the semiconductor layer. With this, a region where the second insulating film and the first insulating film are stacked in the sequence can be provided on the semiconductor layer. Also, it is preferable that the second insulating film is disposed so that the upper surface of the second insulating film is higher than the upper surface of the ridge in the region where the electrode has been disposed. With this, a cushion effect can be exerted on the ridge, and the stress on the ridge and its adjacent region can be reduced. Moreover, it is preferable that the second insulating film includes the same material as in the first insulating film. Accordingly, a strong adhesion can be obtained.

Typically, the adhesion film is disposed to secure the adhesion between the first insulating film and/or the second insulating film and the electrode, and is formed in the substantially same manner as described above. Especially, it is preferable that the adhesion film is disposed in a manner so as to secure the region (indicated by arrow "a" in FIG. 3) where the second insulating film, the first insulating film, and the adhesion film are stacked in sequence on the semiconductor layer. With this configuration, an excess interface which is in contact with the adhesion film does not occur, so that an adhesion film made of a material having insufficient adhesion with the second insulating layer can also be used. It is preferable that a portion of the upper surface of the adhesion film is higher than the top surface of the ridge (see FIG. 3). Accordingly, a cushion effect can be secured.

It is preferable that the electrode has a protrusion protruding toward the semiconductor layer at least on the opposite surface from the semiconductor layer, and is disposed so as to be in contact with the adhesion film. In this case, the protrusion indicates a shape, as shown in FIG. 3, protruding toward the semiconductor layer at both sides of the ridge and protruding back toward the electrode at the distal portions of the semiconductor layer, other than the shape as shown in the p-side electrode in FIG. 2 in which the distal portions thereof do not protrude back toward the electrode. In other words, the protrusion here does not include a shape in which bends are made only at both sides of the ridge. With such a shape described above, the contact area between the electrode and the adhesion film can be secured to a maximum extent.

The electrode described above may be disposed not only over the first insulating film via the adhesion film, but also over from the first insulating film to the second insulating film via the adhesion film. With this construction, the adhesion area with the adhesion film can be increased so that adhesion can be strengthened.

EXAMPLES

Examples of the semiconductor device of the present invention will be described in detail below.

Example 1

As shown in FIG. 1, a semiconductor device according to the present invention comprises the structure described below.

An under layer 11 comprising a buffer layer of GaN and an undoped GaN layer is formed on a sapphire substrate 10.

An n-type semiconductor layer 12 is formed on the under layer 11. The n-type semiconductor layer 12 comprises an n-type contact layer of GaN doped with $1×10^{18}/cm^3$ of Si, a crack preventing layer of $In_{0.06}Ga_{0.94}N$, a multilayer n-type cladding layer with alternately stacked layers of a layer A of undoped AlGaN and a layer B of GaN doped with $1×10^{18}/cm^3$ of Si, and an n-type guide layer. Then, an active layer 13 is formed on the n-type semiconductor layer 12. The active layer 13 has a multiquantum well structure (MQW) comprising three cycles of alternately stacked layers of a barrier layer of $In_{0.05}Ga_{0.95}N$ doped with $5×10^{18}/cm^3$ of Si and a well layer of undoped $In_{0.1}Ga_{0.9}N$, and a barrier layer stacked thereon. A p-type semiconductor layer 14 is formed on the active layer 13. The p-type semiconductor layer 14 comprises a p-type electron confinement layer of AlGaN doped with $1×10^{19}/cm^3$ of Mg, a p-type light confinement layer of undoped GaN, a p-type cladding layer of a superlattice layer comprising alternately stacked layers of undoped $Al_{0.16}Ga_{0.84}N$ layer and a Mg-doped GaN layer doped with Mg, and a p-type contact layer of p-type Ga doped with $1×10^{20}/cm^3$ of Mg.

A portion of the respective layers of the p-type semiconductor layer, the active layer, and the n-type semiconductor layer is removed so as to partially expose the surface of the n-type contact layer, and an n-side electrode 20 made of Ti—Al is disposed on the exposed surface of the n-type contact layer.

On the surface of the p-type contact layer, for example, a stripe-shaped ridge 14a having a width of about 2 μm is formed. A dielectric film 15 made of $ZrO_2$ with a thickness of 600 angstroms is disposed on the entire surface of the p-type contact layer except the top surface of the ridge 14a, and an adhesion film 16 made of ITO with a thickness of 100 angstroms is disposed on the dielectric film 15.

A p-side electrode 17 made of Ni—Au—Pt is disposed on from the top surface of the ridge to a portion of the adhesive film 16 covering the side surfaces of the ridge and the adjacent portion thereof. Then, the p-side electrode is ohmically connected to the semiconductor layer at the top surface of the ridge 14a.

Further, a protective film 18 is disposed so as to cover a portion of the p-side electrode 17 and a portion of the n-side electrode 20, and the top surfaces and the side surfaces of the semiconductor layer. A p-side pad-electrode 19 and an n-side pad-electrode 21 each made of Ni—Ti—Au are disposed so as to connect to the p-side electrode 17 and the n-side electrode 20 respectively.

A semiconductor device was constructed in a similar manner as described above, except for disposing the adhesive film 16, in order to compare the performance with the above-described device.

Vf was measured for both devices. At room temperature, the device according to the present invention showed about 0.1 V decrease in the Vf value compared with the comparative device in which an adhesive film of ITO film was omitted. More specifically, the VF value of the device of the present invention was 3.9 V or less.

A ball shear test was conducted on each 100 chips of the device of the present invention and the comparative device. In the device of the present invention, no detachment of the electrode was observed at the interface of the p-electrode/adhesive film/dielectric film. On the contrary, in the comparative device, 26 out of 100 chips showed detachment of the electrode.

A die shear test was conducted on each 100 chips of the device of the present invention and the comparative device. In the device of the present invention, no detachment of the electrode was observed at the interface of the p-electrode/adhesive film/dielectric film. On the contrary, in the comparative device, 32 out of 100 chips showed detachment of the electrode.

Here, the ball shear test using a tool was performed to observe detachment of the ball portion of the wire which is in contact with the pad portion when moving the tool horizontally. The die shear test using a tool was performed to determine the strength of adhesion of the chip when moving the tool horizontally.

Further, a semiconductor device was constructed in a similar manner as described above, except that after forming a buffer layer and a under layer 11 on a sapphire substrate 10, a sapphire substrate 10 was removed in order to have a conductive substrate, then, an n-side electrode 20 was disposed on the under side of the conductive substrate and a face-down mounting was performed.

In the semiconductor device thus obtained, as in the above-described case, detachment of the electrode was not observed in both the ball shear test and the die shear test, which were conducted in the same way as described above. Also, a tendency of decrease in the Vf value was observed, as in the above-described case.

Example 2

Figure 2:
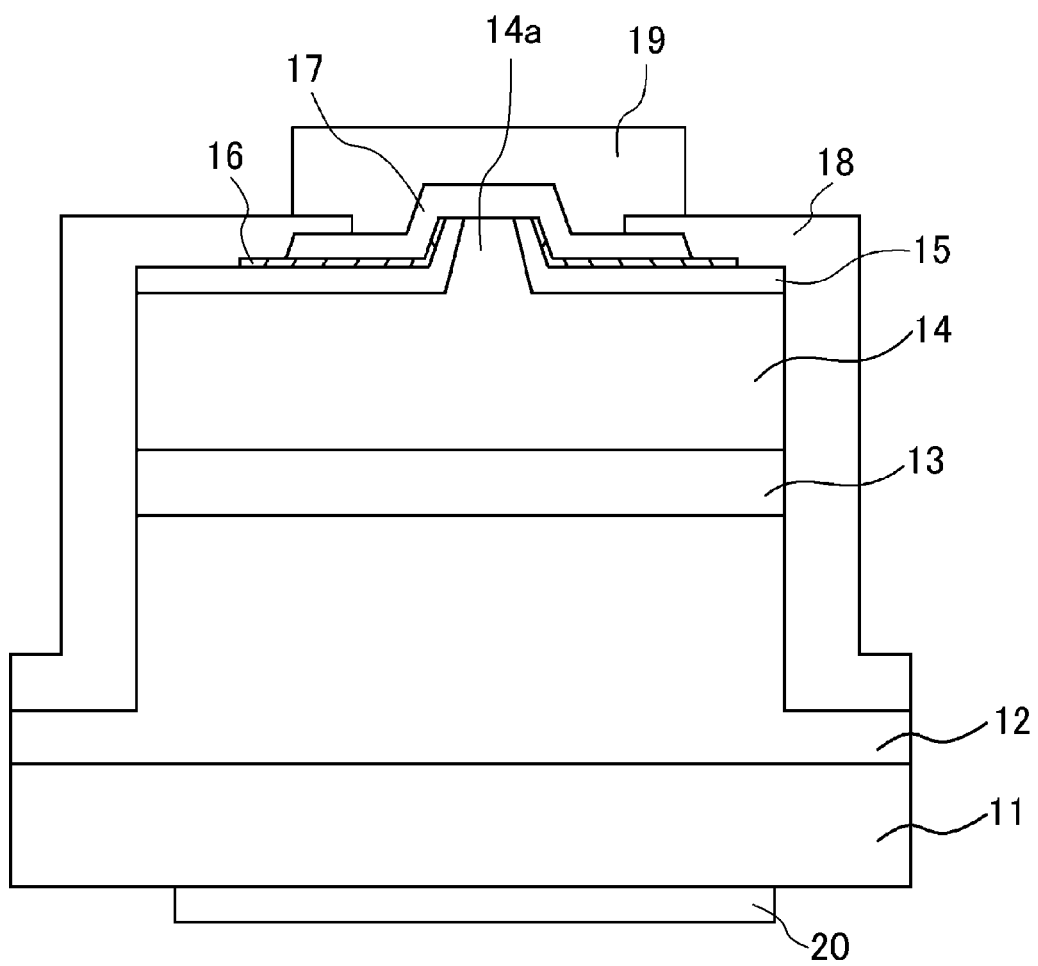
FIG. 2 is a schematic sectional view of the semiconductor device according to another embodiment of the present invention.
Figure 3:
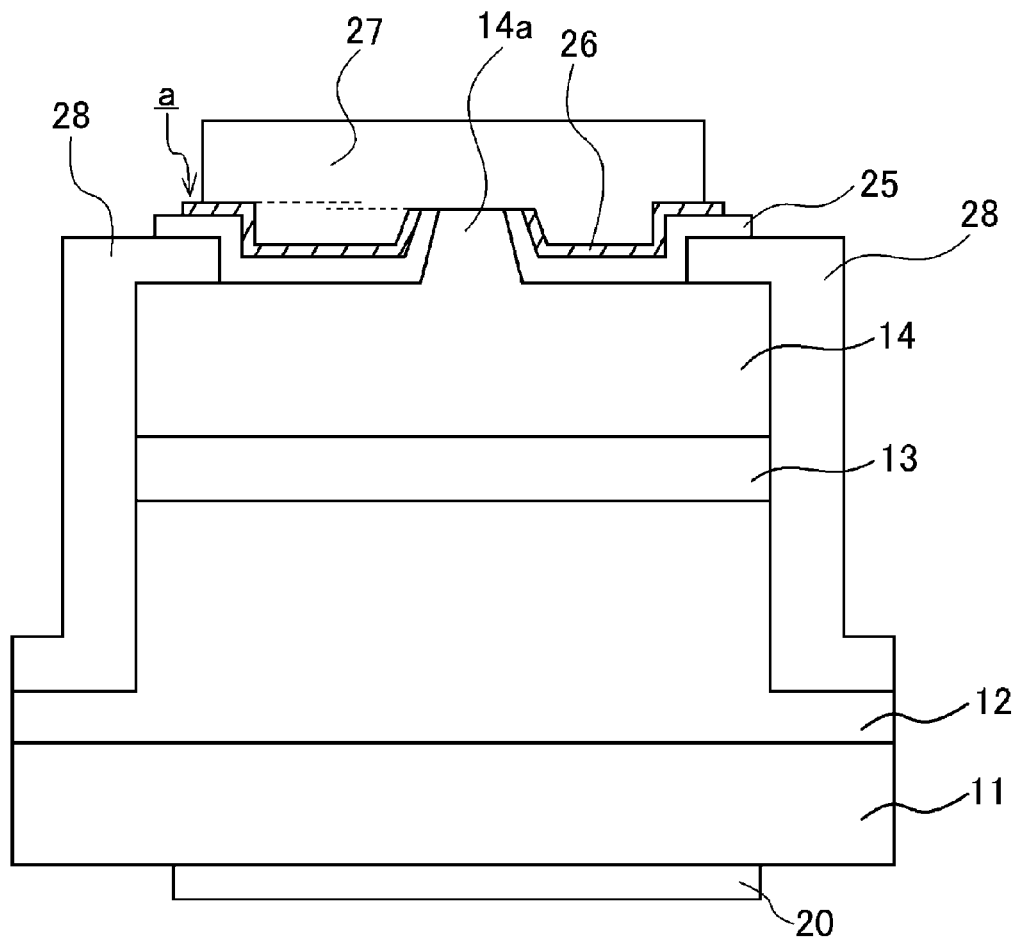
FIG. 3 is a schematic sectional view of the semiconductor device according to still another embodiment of the present invention.
Figure 4:
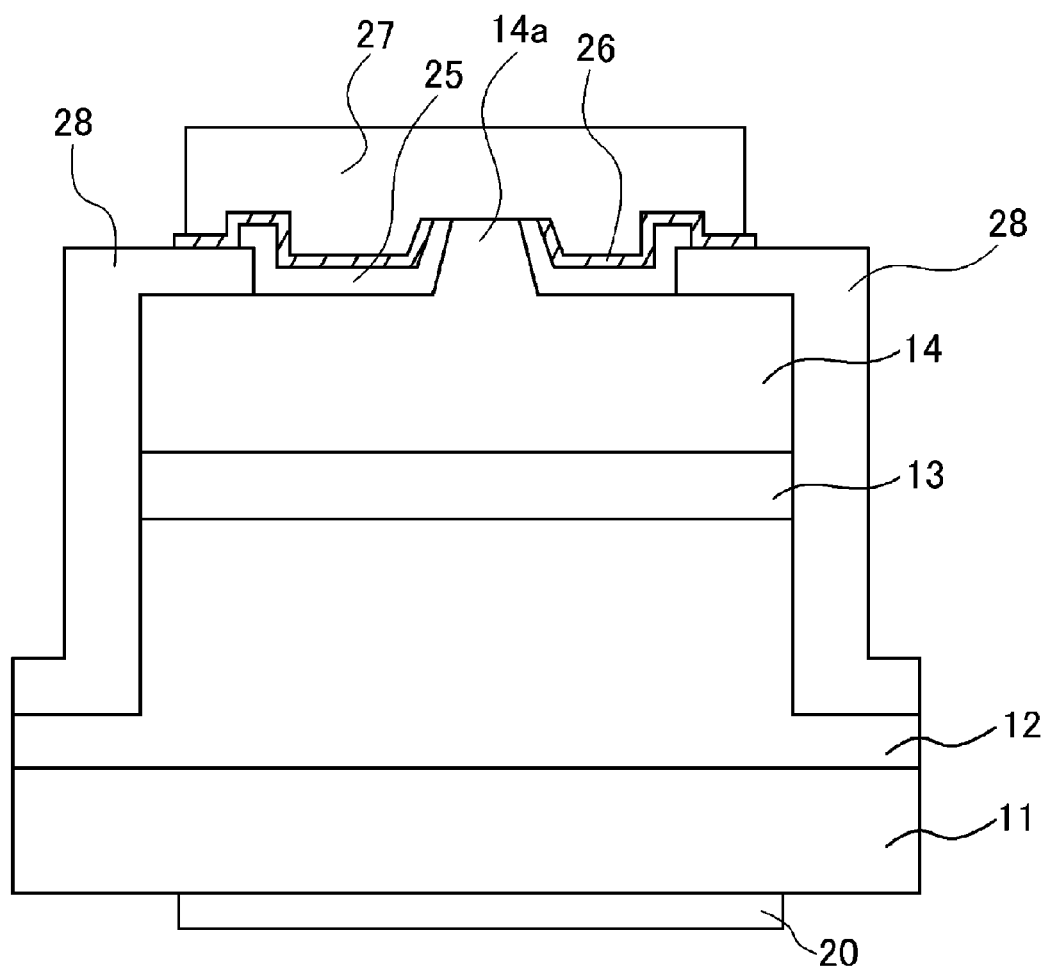
FIG. 4 is a schematic sectional view of the semiconductor device according to yet another embodiment of the present invention.
Figure 5:
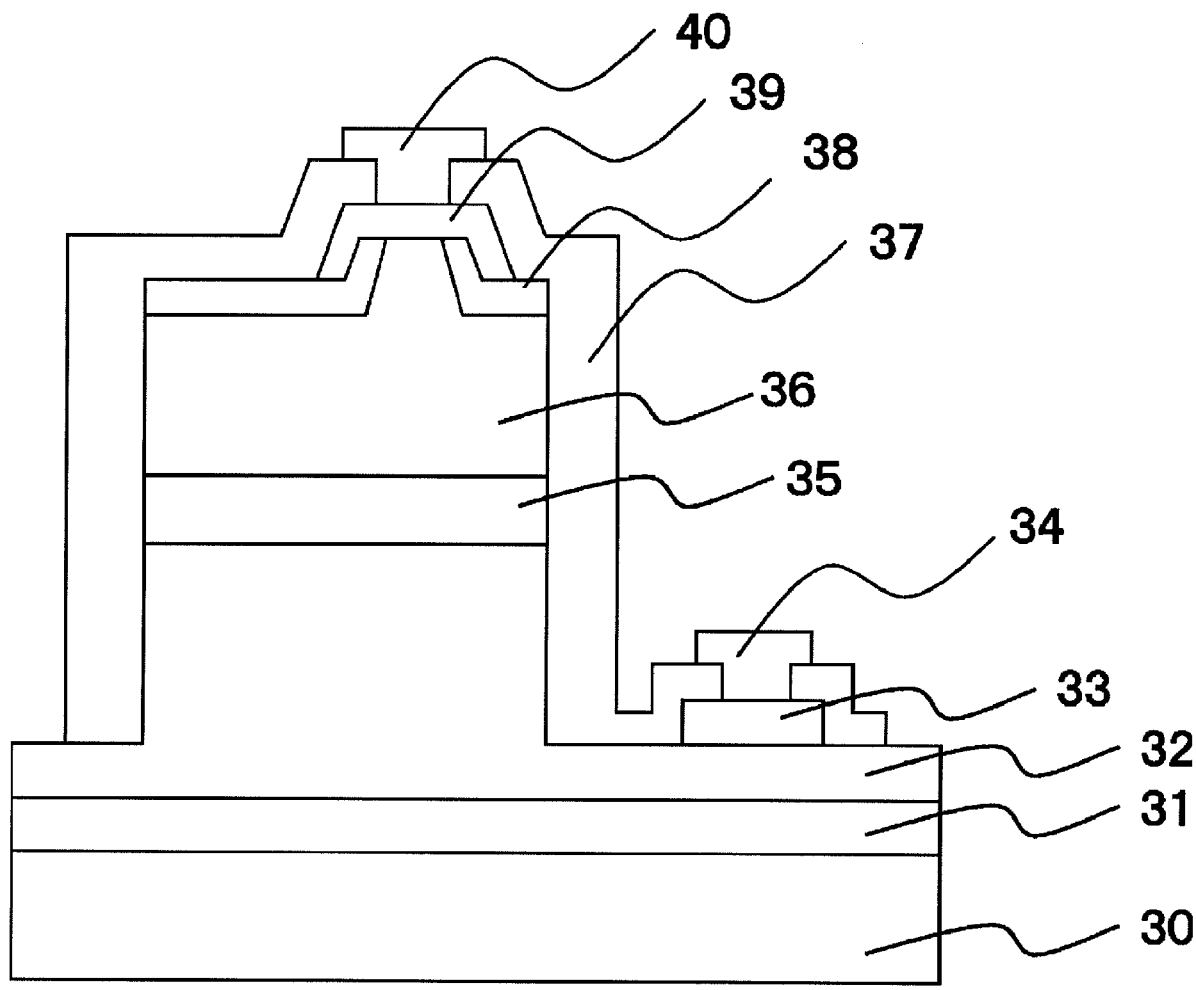
FIG. 5 is a schematic sectional view of the semiconductor laser of conventional semiconductor device.

As shown in FIG. 2, the present example was constructed in a similar manner as in Example 1, except that only an under layer 11 made of a nitride semiconductor layer was used as a substrate and an n-side electrode 20 was disposed on the rear face of the under layer 11.

A similar effect can be obtained even in the device having such a construction.

Example 3

As shown in FIG. 3, the present example was constructed in a similar manner as in Example 1, except that a second insulating film 28 is disposed so as to cover a portion of the surface of a p-type semiconductor layer 14 and the side surfaces thereof, a first insulating film 25 is disposed so as to cover a portion of the surface of the second insulating film 28 and the side surfaces of the ridge, and an adhesion film 26 is disposed so as to cover a portion of the first insulating film 25.

Here, in the semiconductor device, the second insulating film 28, the first insulating film 25, and the adhesion film 26 are disposed in sequence on a portion of the p-type semiconductor layer 14 (arrow "a"). Also, a portion of the top surface of the adhesion film is located higher than the top surface of the ridge 14a.

Further, an electrode 27 is integrally formed with a typical p-side electrode and a p-pad electrode and has a protrusion protruding toward the p-type semiconductor layer 14.

With this construction, strong adhesion between the adhesion film and the electrode can be obtained and detachment of the electrode can be prevented, as well or better than the device of Example 1.

INDUSTRIAL APPLICABILITY

The present invention is applicable to all devices comprising a semiconductor layer, for example, a light emitting element, a photodetector, a CCD, a transistor, a conversion device such as a capacitor, a resistor, a thyristor, and a photovoltaic device, and a circuit and the like using two or more of the aforementioned devices in combination.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A semiconductor device having an electrode electrically connected to a semiconductor layer having a stripe-shaped ridge on a surface thereof, comprising:
    a first insulating film disposed on a region between said semiconductor layer and the electrode,
    a second insulating film disposed from a side surface to an upper surface of said semiconductor layer and in contact with said first insulating layer, and
    an adhesion film disposed so as to cover at least a portion of said first insulating film,
    said electrode having a protrusion protruding toward the semiconductor layer on at least the surface thereof facing said semiconductor layer, said electrode being disposed so as to come in contact with said adhesion film, and said electrode being disposed in contact with the semiconductor layer at a top surface of the stripe-shaped ridge of the semiconductor layer,
    said device having a region where the second insulating film, the first insulating film, and the adhesion film are stacked in sequence on the semiconductor layer.

2. A semiconductor device having an electrode electrically connected to a semiconductor layer having a stripe-shaped ridge on a surface thereof, comprising:
    a first insulating film disposed on a region between said semiconductor layer and the electrode,
    a second insulating film extending from a side surface to an upper surface of said semiconductor layer and in contact with said first insulating layer,
    an adhesion film covering at least a portion of said first insulating film and a portion of a top surface thereof being higher than a top surface of the ridge,
    a region having the second insulating film, the first insulating film, and the adhesion film stacked in sequence thereon, and
    a protrusion protruding toward the semiconductor layer formed on at least a surface of said electrode facing said semiconductor layer, said electrode disposed in contact with said adhesion film.

3. The semiconductor device according to claim 2, wherein the second insulating film includes the same material as in the first insulating film.

4. The semiconductor device according to claim 2, wherein the adhesion film comprises a degenerate semiconductor or a metal including a platinum group metal.

5. The semiconductor device according to claim 2, wherein the electrode is disposed over the first insulating film and the second insulating film via the adhesion film.

6. The semiconductor device according to claim 2, wherein said device is for face-down mounting.

7. The semiconductor device according to claim 2, wherein said adhesion film comprises a degenerate semiconductor.

8. The semiconductor device according to claim 2, wherein said adhesion film comprises at least one selected from the group consisting of ITO, IZO, GZO, and AZO.

9. The semiconductor device according to claim 2, wherein said dielectric film comprises at least one selected from the group consisting of $ZrO_2$, $SiO_2$, and $HfO_2$.

10. The semiconductor device according to claim 2, wherein said electrode comprises a layer including nickel or an alloy of nickel.

* * * * *